(12) United States Patent
Yang et al.

(10) Patent No.: US 8,305,820 B2
(45) Date of Patent: Nov. 6, 2012

(54) SWITCHED CAPACITOR BASED NEGATIVE BITLINE VOLTAGE GENERATION SCHEME

(75) Inventors: Hsiu-Hui Yang, Qingshui Township (TW); Jack Liu, Taipei (TW); Wei Min Chan, Sindian (TW); Shao-Yu Chou, Chu Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 373 days.

(21) Appl. No.: 12/769,694

(22) Filed: Apr. 29, 2010

(65) Prior Publication Data

US 2011/0267901 A1    Nov. 3, 2011

(51) Int. Cl.
*G11C 7/00*    (2006.01)

(52) U.S. Cl. ......... 365/189.09; 365/189.02; 365/189.05; 365/191; 365/154

(58) Field of Classification Search ............ 365/189.09, 365/189.02, 185.05, 191, 154

See application file for complete search history.

(56) References Cited

U.S. PATENT DOCUMENTS

| | | | |
|---|---|---|---|
| 6,411,166 B2 * | 6/2002 | Baschirotto et al. | 330/258 |
| 7,068,251 B2 * | 6/2006 | Lin et al. | 345/87 |
| 7,782,653 B2 * | 8/2010 | Hashimoto | 365/154 |

* cited by examiner

*Primary Examiner* — Connie Yoha
(74) *Attorney, Agent, or Firm* — Duane Morris LLP (57) ABSTRACT

A memory device includes an array of memory cells, the memory device including a bitline biasing circuit for biasing a bitline during a write operation. The bitline biasing circuit operating to provide a negative biasing voltage to the bitline. The magnitude of the negative biasing voltage is inversely proportional to a memory cell supply voltage level provided at a memory cell supply voltage node.

19 Claims, 11 Drawing Sheets

| | V (nbl) | |
|---|---|---|
| VDD (Vwl) | conventional nbl | SC without inv |
| 1 | -0.24 | -0.19 |
| 0.95 | -0.23 | -0.20 |
| 0.9 | -0.22 | -0.21 |
| 0.85 | -0.21 | -0.22 |
| 0.8 | -0.20 | -0.23 |
| 0.75 | -0.19 | -0.24 |
| 0.7 | -0.18 | -0.25 |
| 0.65 | -0.16 | -0.26 |
| 0.6 | -0.15 | -0.27 |
| 0.55 | -0.14 | -0.28 |
| 0.5 | -0.13 | -0.29 |
| 0.45 | -0.11 | -0.30 |
| 0.4 | -0.10 | -0.31 |

SWITCHED CAPACITOR BASED NEGATIVE BITLINE VOLTAGE GENERATION SCHEME

FIELD OF THE INVENTION

The present invention relates to memory cells, and more specifically to biasing techniques for memory cells.

BACKGROUND OF THE INVENTION

Figure 1:
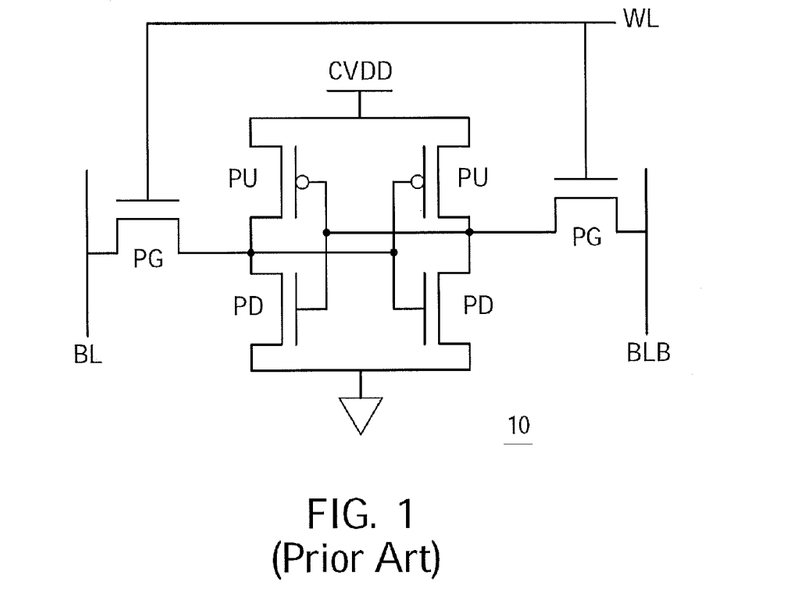
FIG. 1 illustrates a prior art SRAM cell.

Static random access memories (SRAM) are commonly used in integrated circuits. Embedded SRAM is particularly popular in high speed communication, image processing and system on chip (SOC) applications. SRAM cells have the advantageous feature of holding data without requiring a refresh. FIG. 1 is a circuit diagram of a six transistor single-port SRAM cell circuit 10. Typically, a SRAM cell includes two pass-gate transistors (labeled PG), through which a bit can be read from or written into the SRAM cell. The basic cell 10 includes two cross-coupled inverters including two pull-up (PU) and two pull-down (PD) transistors, which form a data storage latch. The pass gate (PG) transistors are coupled between the differential bitlines (BL and BLB) for reading a bit from and/or writing a bit to the SRAM cell latch. The gates of the pass-gate transistors are controlled by a wordline. Another type of SRAM cell is referred to as dual port SRAM cell, which includes four pass-gate transistors.

In deep sub-micron technology, device mismatch and lowered wordline voltage levels affect the write capabilities of the SRAM cell. That is, the Von (Vgs–Vth) of the program transistors (PG) is decreased, degrading the write capability of the SRAM cell. For this reason, during a write operation a negative pulse is provided to the bitline (BL/BLB) to improve Von of the PG transistors.

Figure 2:
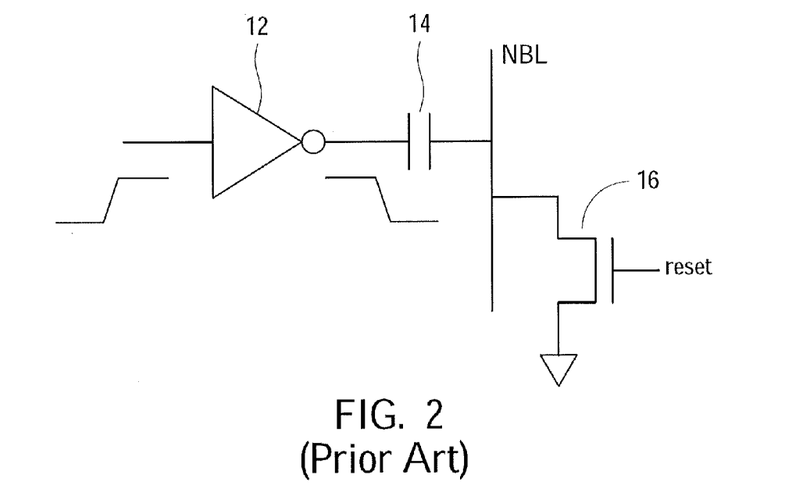
FIG. 2 illustrates a prior art biasing circuit for providing a negative bit line voltage for write operations.
Figure 3:
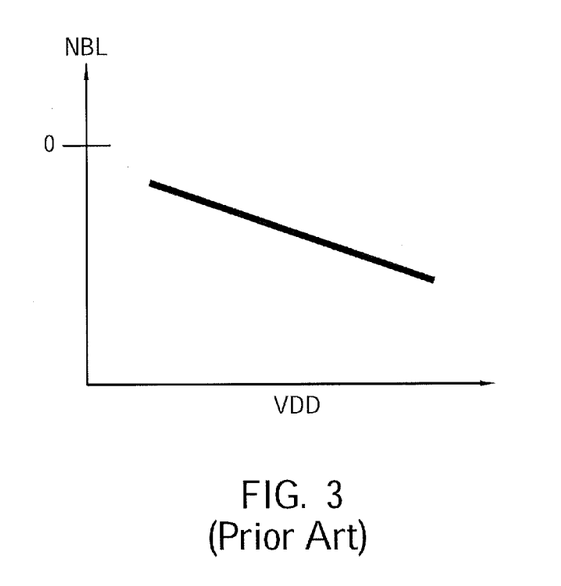
FIG. 3 is a graph illustrating the relationship between the VDD power supply voltage and the negative bit line voltage provided by the prior art biasing circuit of FIG. 2.

FIG. 2 is a circuit diagram of one conventional approach to providing the negative pulse to the bitline. This method relies on capacitive coupling through an inverter to pull down the BL voltage to a negative value. As shown in FIG. 2, a positive pulse is provided to an inverter 12, which is coupled to the BL (labeled as NBL to represent a negative bitline voltage) through capacitor 14. Transistor 16 is responsive to signal RESET to reset the bitline to ground after the write operation. The voltage that is coupled to the bitline in FIG. 2 is tied to the supply voltage VDD of the inverter 12. As such, if the supply voltage VDD of the inverter 12 is lowered, the magnitude of the negative voltage pulse is also lowered. This relationship is shown in FIG. 3. At lower VDD levels, a higher, not lower, negative voltage pulse magnitude is needed to improve write capability. Moreover, the higher magnitude negative voltage under higher VDD conditions, as shown in FIG. 3, can disturb data values on unselected cells.

An improved biasing method for write operations in SRAM cells is desired.

SUMMARY OF THE INVENTION

A memory device includes an array of memory cells, the memory device including a bitline biasing circuit for biasing a bitline during a write operation. The bitline biasing circuit operating to provide a negative biasing voltage to the bitline. The magnitude of the negative biasing voltage is inversely proportional to a memory cell supply voltage level provided at a memory cell supply voltage node.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning attachments, coupling and the like, such as "coupled", "connected" and "interconnected," refer to a relationship wherein structures communicate with one another either directly or indirectly through intervening structures, unless expressly described otherwise.

A new circuit scheme is presented herein for generating the negative coupling voltage for the bitline of a SRAM cell. An example of an SRAM cell is shown in FIG. 1. Those of ordinary skill in this art will recognize that the SRAM cell is provided as part of an array of SRAM cells arranged in rows and columns and biased by a respective wordline and bitline pair from a plurality of provided wordlines and bitlines. Importantly, the coupling voltage has a negative trend with respect to VDD. That is, as VDD decreases, the magnitude of the negative bitline voltage increases (i.e., it gets more negative) and as VDD increases, the magnitude of the negative bitline voltage decreases (i.e., it gets less negative).

In one embodiment, the negative bitline voltage is generated using a switched capacitor scheme. The capacitor is charged by a voltage source $V_{IO}$, which may be the constant supply voltage for the chip IO pads and usually larger than the supply voltage VDD for the core devices. For example, $V_{IO}$ may be equal to 1.8V and VDD may be equal to 0.9V at for 45 nm an 28 nm generations. The capacitor is then connected to the bitline and a coupling voltage equal to the difference between constant chip voltage $V_{IO}$ and VDD is generated. The negative coupling voltage has an inverse relationship with VDD. As such, lower VDD levels provide negative coupling voltages with greater magnitudes, which will provide good write-ability at low VDD levels while not disturbing other cells in the same column of cells.

The biasing scheme also saves area when compared to the prior art approach describes above since the size of the capacitor may be reduced. Moreover, the biasing scheme could be implemented as described below to improve readability as well.

Figure 4:
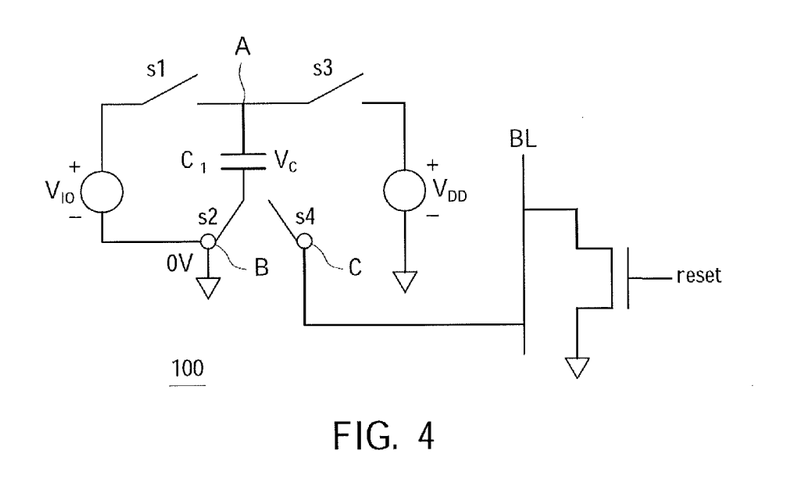
FIGS. 4, 4A, and 4B illustrate an embodiment of a negative bit line voltage biasing circuit according to the present invention.

FIG. 4 illustrates an embodiment of a biasing circuit 100 for coupling a negative voltage to a bitline of a SRAM cell in a conventional SRAM cell array having a plurality of rows and columns of SRAM cells. The illustrated embodiment includes a capacitor (labeled $C_1$), a VDD power supply and a second power supply labeled $V_{IO}$. The biasing circuit 100 includes four switches S1, S2, S3 and S4 coupled to nodes A, B and C as described below. One conductor of the capacitor $C_1$ is coupled to node A. Node A can be selectively coupled to voltage source $V_{IO}$ via switch Si and to VDD by switch S3. The other conductor of the capacitor is selectively coupled either to node B or to node C by switches S2 and S4, respectively. It should be noted that no inverter, as shown in FIG. 2 is required.

Figure 4A:
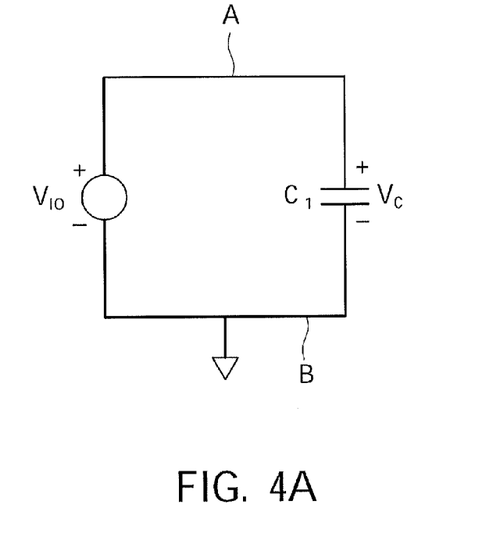
Figure 4B:
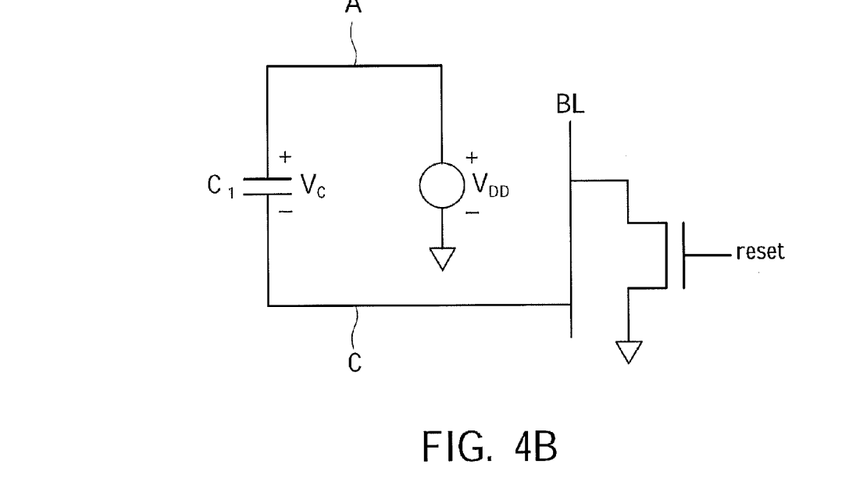
Figure 5:
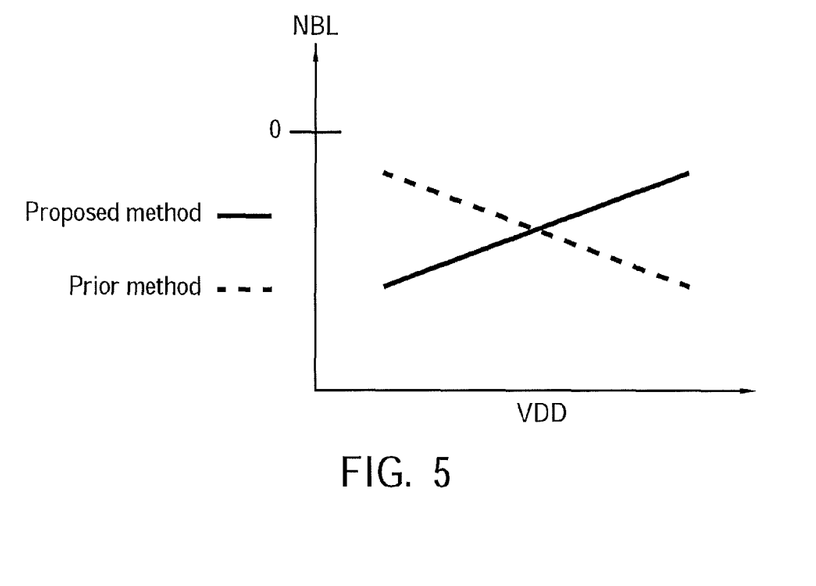
FIG. 5 is a graph comparing the operation of the biasing circuit of FIG. 4 with that of the prior art biasing circuit of FIG. 2.

During phase 1, switches S1 and S2 are triggered (i.e., turned on/closed) to connect capacitor $C_1$ to voltage source $V_{IO}$. Switches S3 and S4 are open (i.e., turned off). This phase 1 state is shown in FIG. 4A. Phase 1 charges the capacitor voltage Vc of capacitor C to the value of $V_{IO}$. During phase 2, switches S1 and S2 are opened and switches S3 and S4 are turned on. This phase 2 state is shown in FIG. 4B. The biasing voltage at node C will be 0+VDD−Vc from 0V transiently (i.e., the bit line is initial grounded by the reset transistor), which equals VDD−$V_{IO}$. $V_{IO}$ can be set to the positive supply voltage of the chip. For example, $V_{IO}$ may be set to 1.8V and VDD targeted at 0.9V. So, the expected bitline voltage would be −0.9V. Assuming that the chip voltage $V_{IO}$ is constant, but VDD can vary, the negative coupling $V_{BL}$ will have an inverse relationship to the circuit supply voltage VDD as shown in FIG. 5. For example, if VDD is 0.7V instead of 0.9V, then $V_{BL}$ becomes −1.2V, and if VDD is 0.5V instead of 0.9V, then $V_{BL}$ becomes −1.4V.

As noted above, this inverse relationship ensures that there is an adequate negative bitline voltage under conditions of lower circuit supply voltages VDD. Moreover, under higher VDD conditions, lower rather than higher magnitude negative bitline voltages are provided, which avoids disturbing data values on unselected cells.

Figure 6A:
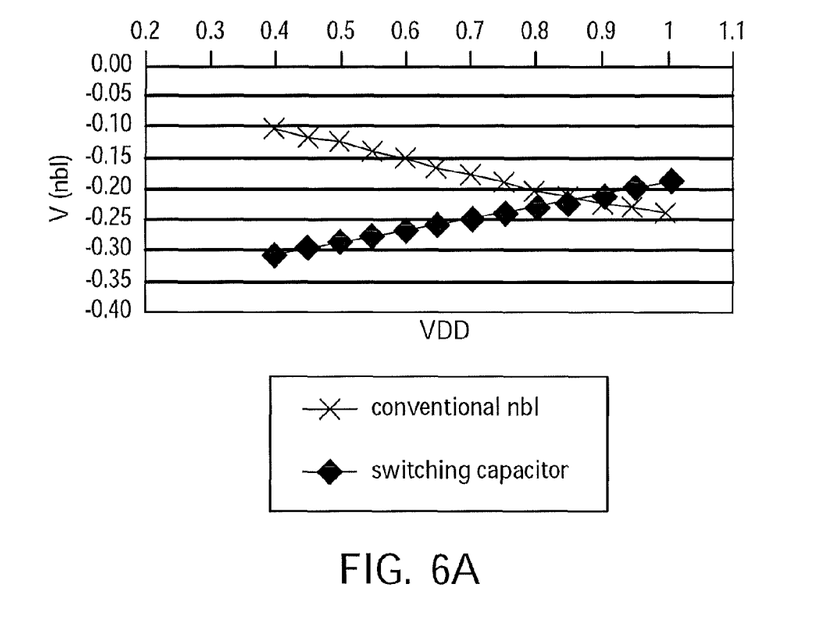
FIG. 6A is a plot showing the results of a simulation of the biasing circuit of FIG. 4 and the prior art biasing circuit of FIG. 2
Figure 6B:
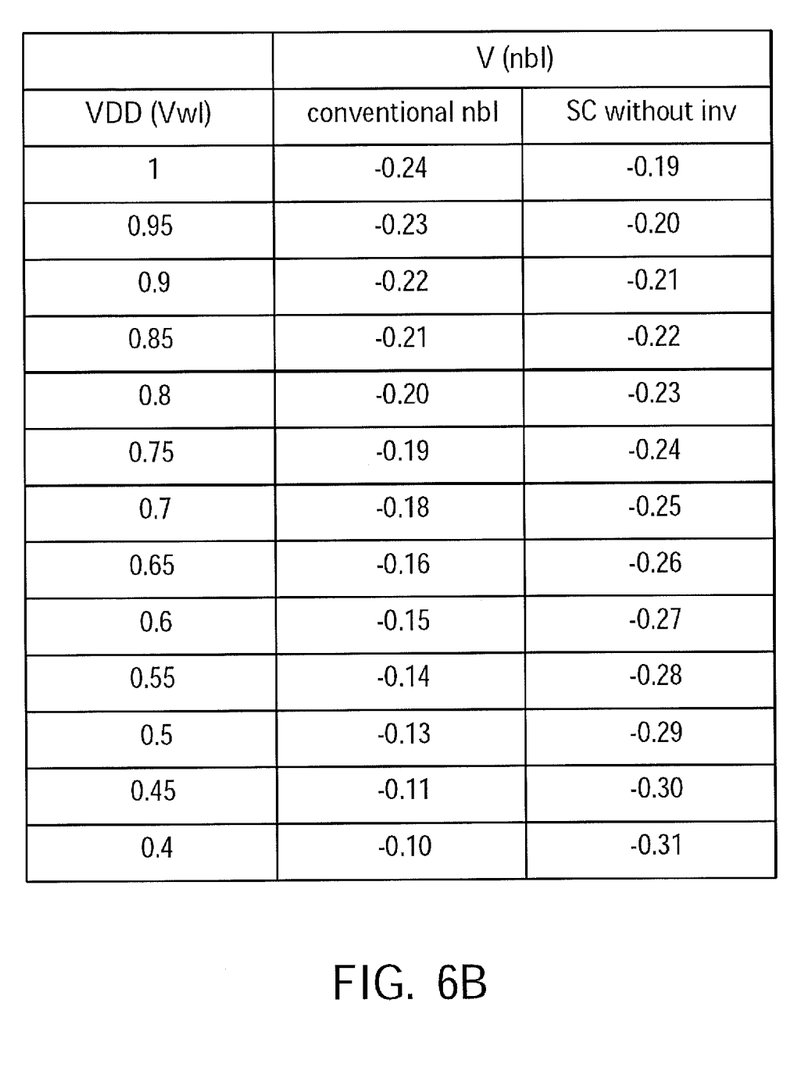
FIG. 6B is a table showing the raw data used to provide the plot of FIG. 6A.

FIGS. 6A and 6B show the results of a simulation of the biasing circuit shown in FIG. 4 with $V_{IO}$ set to 1.8 V. More specifically, FIG. 6A is a plot showing the bitline biasing voltage versus VDD for the conventional biasing circuit (FIG. 2) and for the switched capacitor biasing circuit (FIG. 4), and FIG. 6B is a table of the data points plotted in FIG. 6A. As can be seen from the plot of FIG. 6A and the data of FIG. 6B, as the magnitude of VDD, which is used to bias the wordline of the SRAM cell, decreases the magnitude of the negative biasing voltage provided by the biasing circuit of FIG. 5 increases whereas the magnitude of the negative biasing voltage provided by the biasing circuit of the prior art (FIG. 2) decreases.

Moreover, the biasing circuit illustrated in FIG. 4 provides a reduction in circuit size when compared to the prior art circuit of FIG. 2. For example, in the circuit of FIG. 2, the capacitor required for −0.25V bitline biasing at a VDD of 0.4V is 54 fF, whereas the capacitor required for the biasing circuit of FIG. 4 is only 7.6 fF. A comparison of the two approaches is shown in the table below:

|  | Conventional NBL Biasing | Switched Capacitor NBL Biasing |
| --- | --- | --- |
| Inverter | Yes (1%) | None |
| Capacitor | Yes (10%) | Yes (2%) |
| Level Shifter | None | Yes (6%) |
| Estimated Increase Area of LIO | 11% | 8% |

The percentage increases shown in the chart are relative to a bitline biasing circuit that does not bias with a negative bitline voltage. The conventional biasing circuit (FIG. 2) requires an inverter, which adds an estimated 1% to the area of the local IO (LIO) circuit. The switched capacitor biasing circuit (FIG. 4) does not use an inverter. As discussed above, the size of the capacitor for the switched capacitor biasing circuit is smaller than that required for the conventional biasing circuit. Finally, a level shifter circuit may be required for driving some of the switches of the switched capacitor biasing circuit, at a cost of about 6%. When totaled, the switched capacitor biasing circuit requires less area than the conventional negative bitline biasing circuit.

Figure 7:
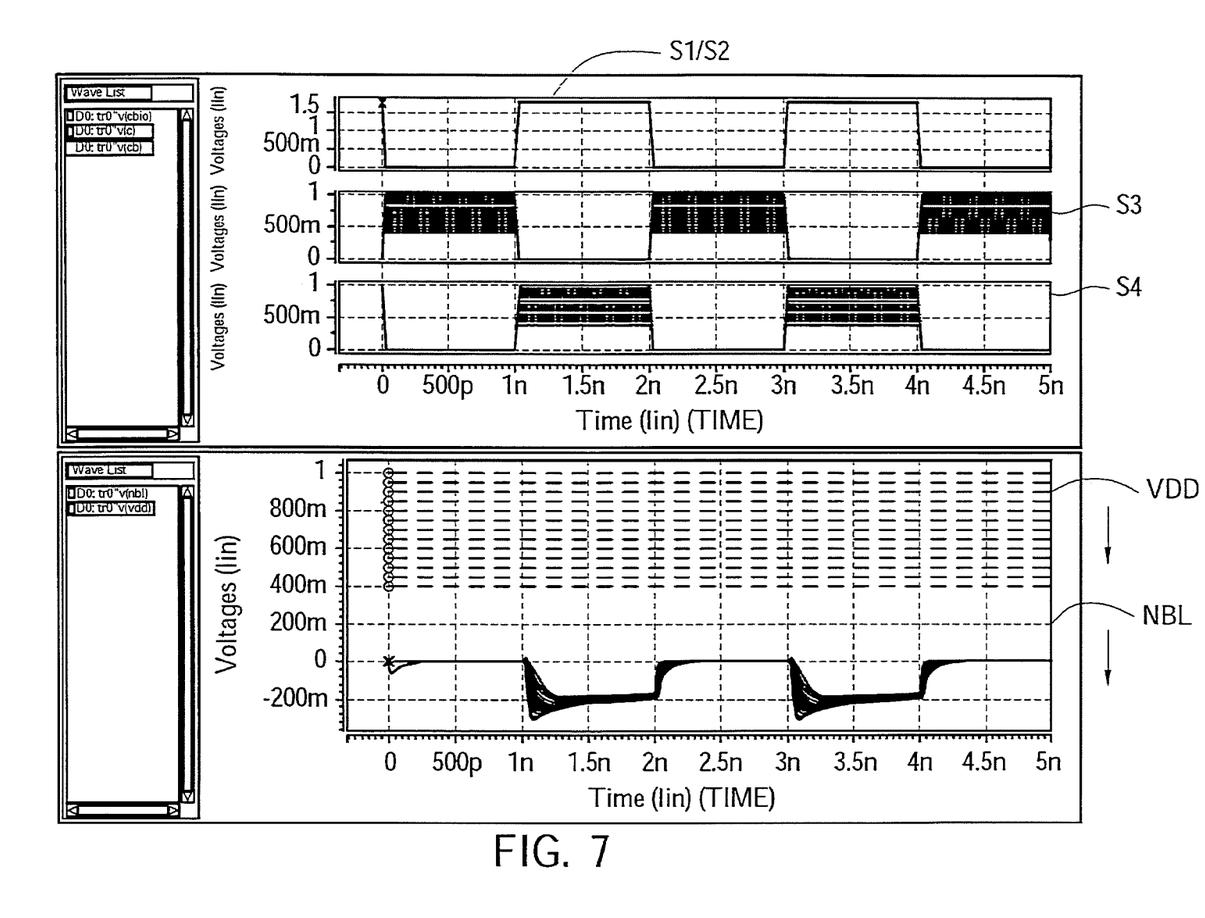
FIG. 7 is a graph illustrating the operation of the biasing circuit of FIG. 5 over time and across a range of power supply voltages.

FIG. 7 shows another set of simulation results, specifically the transient waveforms for the biasing approach of FIG. 5 when VDD is swept from 1V to 0.4V. The waveforms for triggering switches S1, S2, S3 and S4 are shown. In the simulation, switch S1 was a PMOS transistor and switches S2 to S4 were NMOS transistors. As can be seen from the figure, from 0-1 ns switches S1 (PMOS) and S2 (NMOS) are triggered together to charge the capacitor C while switches S3 (NMOS) and S4 (NMOS) are off. Then switches S3 and S4 are triggered to couple the capacitor to the bitline to provide the negative bias. As can be seen from the figure, switches S1 and S3 are driven by a higher voltage, such as from a level shifter, whereas switches S2 and S4 can be driven by the VDD circuit power supply. As shown in the bottom half of the graph of FIG. 7, as the level of VDD decreases (shown by the arrow to the right of the VDD plot, the magnitude of the negative bitline voltage (NBL) increases. There is an initial spike in the voltage level of NBL, when the capacitor is fully charged, followed by the capacitor discharging, and NBL settling around −200 mV.

Figure 8:
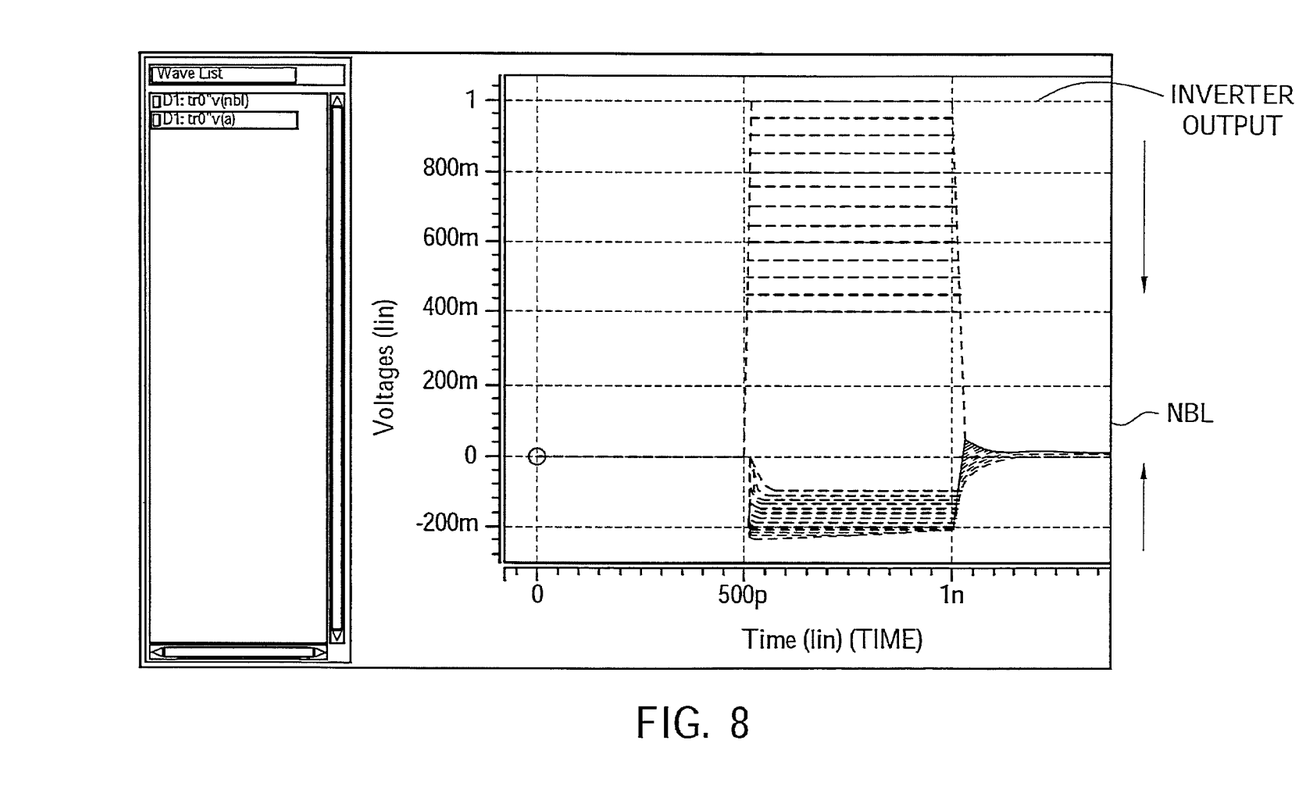
FIG. 8 is a graph illustrating the operation of the prior art biasing circuit of FIG. 2 over time and across a range of power supply voltages.

In contrast, FIG. 8 shows the operation of the conventional biasing circuit (FIG. 2). As can be seen from FIG. 8, as the voltage level of the inverter output decreases in response to decreases in the VDD level, the magnitude of the NBL also undesirably decreases.

Figure 9:
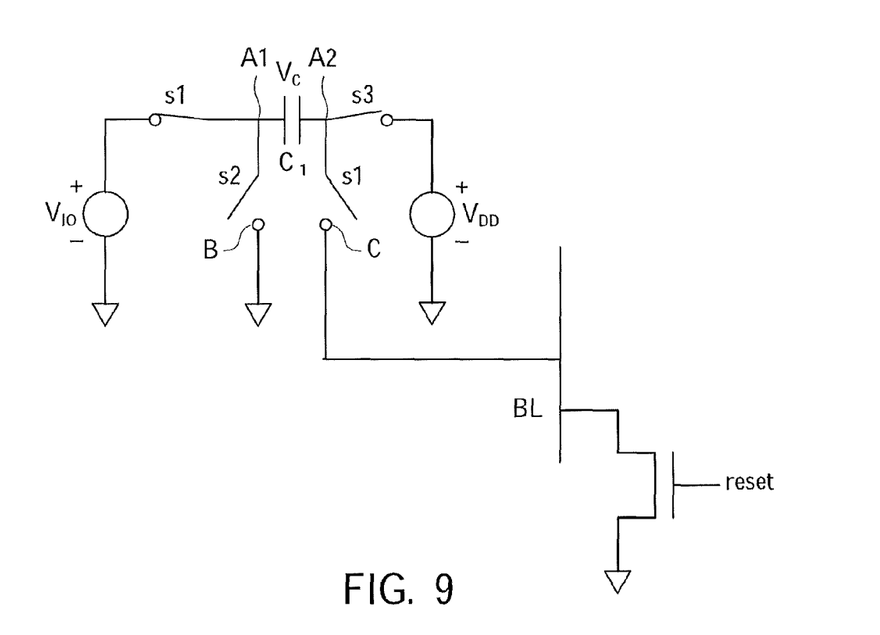
FIG. 9 illustrates an alternative embodiment of a negative bit line voltage biasing circuit according to the present invention.
Figure 10:
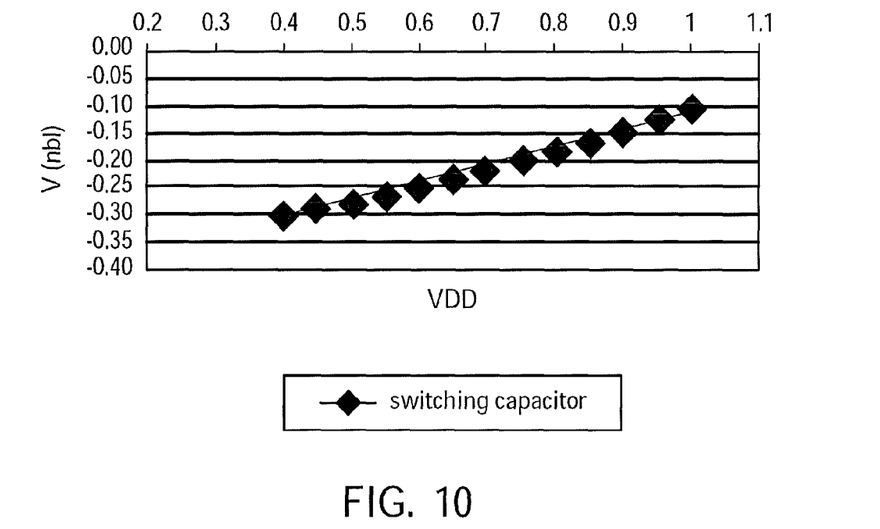
FIG. 10 is a plot showing the results of a simulation of the biasing circuit of FIG. 9.
Figure 11:
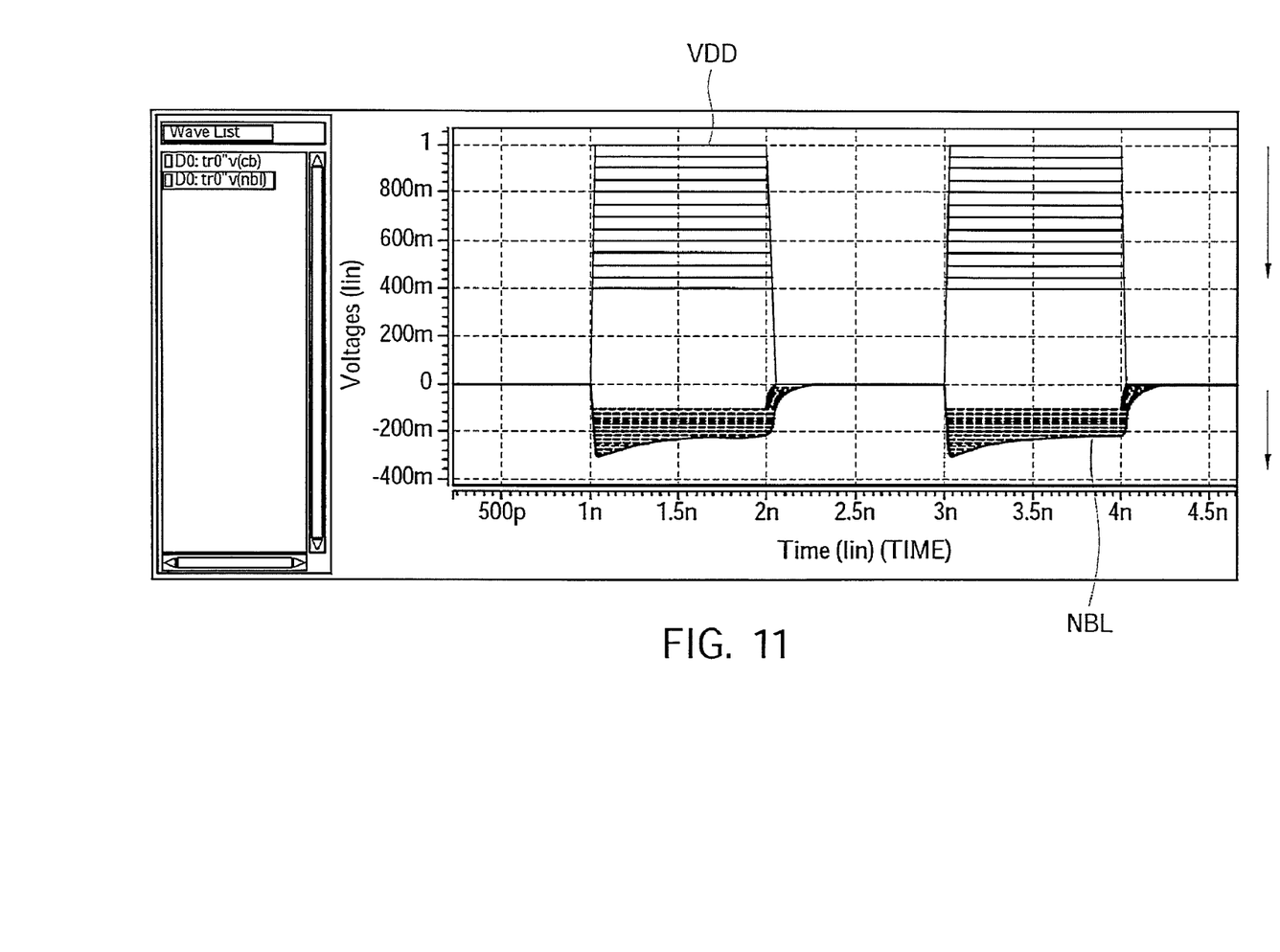
FIG. 11 is a graph illustrating the operation of the biasing circuit of FIG. 9 over time and across a range of power supply voltages.

FIG. 9 shows an alternative embodiment of a negative bitline voltage biasing circuit. The circuit of FIG. 9 is identical to that of FIG. 5 except that the capacitor $C_1$ has been moved between nodes A1 and A2. During phase 1, switches S1 and S3 are on and switches S2 and S4 are open. This charges the capacitor to $V_{IO}$−VDD. During phase 2, switches S1 and S3 are opened and switches S2 and S4 are triggered to connect the charged capacitor reversibly between nodes B and C. This connection couples a negative voltage to the bitline. The simulation results showing the inverse trend between the level of VDD and the magnitude of the negative bitline voltage are shown in FIG. 10, and the transient waveform results are shown in FIG. 11.

Figure 12:
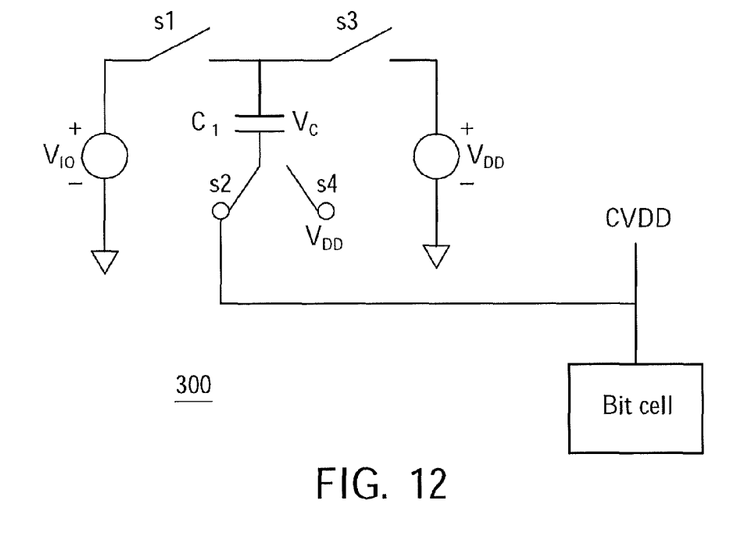
FIG. 12 illustrates an embodiment of a biasing circuit for providing a memory cell power supply voltage during a read operation.
Figure 13:
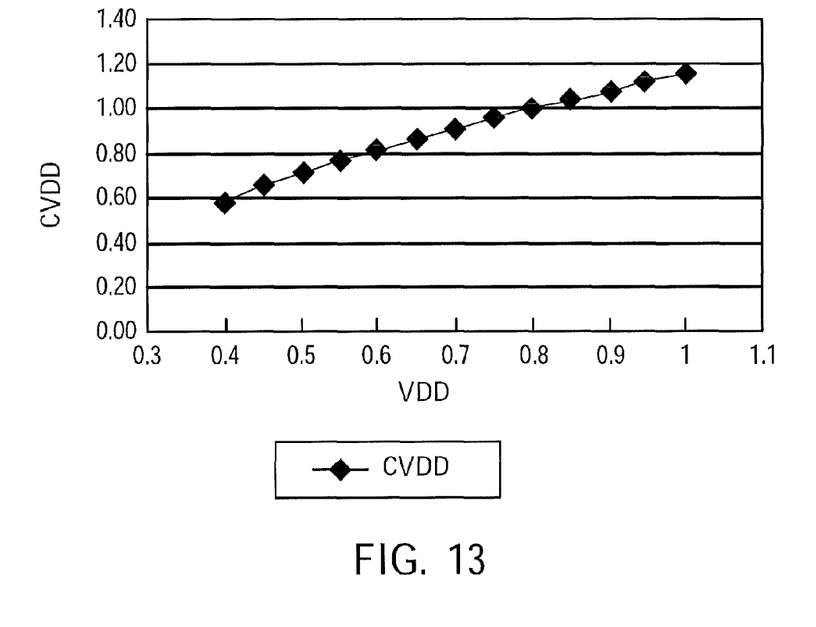
FIG. 13 is a plot showing the results of a simulation of the biasing circuit of FIG. 13.
Figure 14:
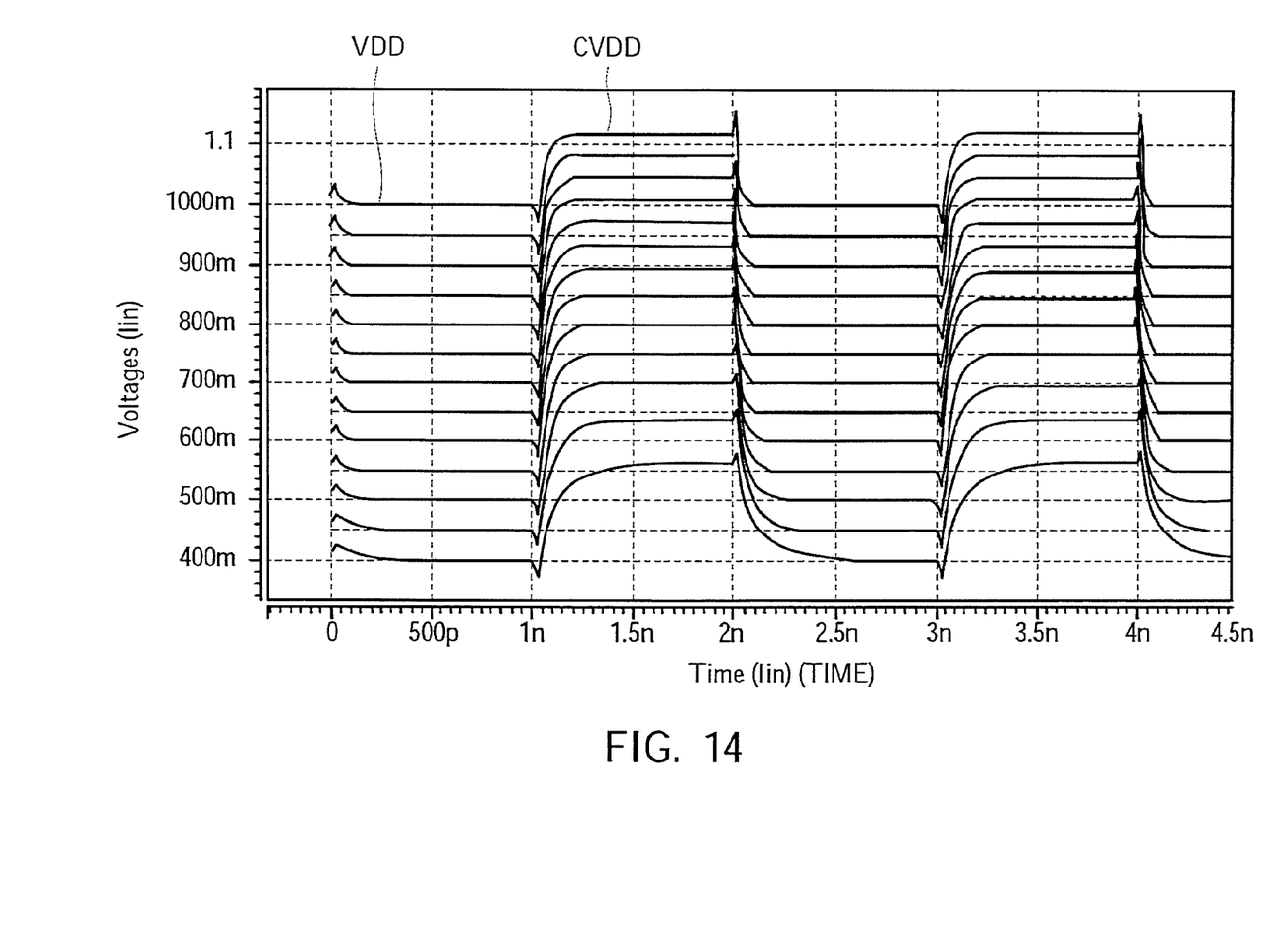
FIG. 14 is a graph illustrating the operation of the biasing circuit of FIG. 13 over time and across a range of power supply voltages.

The basic switching architecture described above could also be used in a biasing circuit for providing the cell supply voltage CVDD. One such biasing circuit is shown in FIG. 12. In conventional SRAM cells 10, as shown in FIG. 1, the sources of the PMOS pull up (PU) transistors are biased by VDD. As VDD decreases, the read ability of the cell is reduced. The biasing circuit 300 of FIG. 12 provides a higher CVDD level than VDD during SRAM reading operations, which helps improve the readability of the cell as VDD decreases. During phase 1, switches S3 and S4 are triggered and switches S1 and S2 are open. This connects the capacitor C1 to VDD to charge it to VDD. During phase 2, switches S3 and S4 are opened to disconnect the capacitor from VDD, and switches S1 and S2 are triggered to connect a first conductor of the capacitor to the power supply $V_{IO}$ and the second conductor of the capacitor to the bit cell node for CVDD (i.e., the sources of the PU transistors of the SRAM cell). During phase 2, the $V_{IO}$ voltage will be divided between C1 and the loading of the CVDD node. The CVDD level is raised and determined by the charge sharing ratio. The relationship between CVDD and VDD in the graph of the simulation in FIG. 13 and the transient waveform graph of FIG. 14 with $V_{IO}$ set to 1.8V. A reset transistor was used to drive CVDD to the VDD level in between operations.

Of course, in embodiments, a SRAM memory device may utilize the improved negative bit line biasing circuits and the improved cell VDD biasing circuits described herein to improve both write and read abilities, respectively.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A memory device comprising an array of memory cells, the memory device including a bitline biasing circuit for biasing a bitline during a write operation, the bitline biasing circuit operating to provide a negative biasing voltage to the bitline, a magnitude of the negative biasing voltage being inversely proportional to a memory cell supply voltage level provided at a memory cell supply voltage node.

2. The memory device of claim 1, wherein the bitline biasing circuit comprises:
   a capacitor;
   a first switching circuit for coupling the capacitor to a positive power supply voltage during a first phase to charge the capacitor; and
   a second switching circuit for coupling the capacitor between the memory cell supply voltage node and the bitline during a second phase following the first phase to provide the negative biasing voltage to the bitline.

3. The memory device of claim 2, wherein the first switching circuit comprises first and second switch elements, the first switch element coupling a first conductor of the capacitor to a positive power supply voltage node corresponding to the positive power supply voltage and the second switch element coupling a second conductor of the capacitor to a ground node.

4. The memory device of claim 3, wherein the second switching circuit comprises third and fourth switch elements, the third switch element coupling the first conductor of the capacitor to the memory cell supply voltage node and the fourth switch element coupling the second conductor to the bitline.

5. The memory device of claim 2, wherein the positive power supply voltage is greater than the memory cell supply voltage.

6. The memory device of claim 1, wherein the memory cells are SRAM cells.

7. The memory device of claim 1, wherein the bitline biasing circuit comprises:
   a capacitor;
   a first switching circuit for coupling the capacitor between a positive power supply voltage node and the memory cell supply voltage node during a first phase to charge the capacitor; and
   a second switching circuit for coupling the capacitor to the bitline during a second phase following the first phase to provide the negative biasing voltage to the bitline.

8. The memory device of claim 7, wherein the first switching circuit comprises first and second switch elements, the first switch element coupling a first conductor of the capacitor to the positive power supply voltage node corresponding to the positive power supply voltage and the second switch element coupling a second conductor of the capacitor to the memory cell supply voltage node.

9. The memory device of claim 8, wherein the second switching circuit comprises third and fourth switch elements, the third switch element coupling the first conductor of the capacitor to a ground node and the fourth switch element coupling the second conductor to the bitline.

10. The memory device of claim 7, wherein the positive power supply voltage is greater than the memory cell supply voltage.

11. A SRAM memory device comprising:
    an array of SRAM memory cells, each cell having at least one pass gate coupled to a bit line; and
    a bitline biasing circuit operating to provide a negative bitline voltage to the bitline during a write operation, a magnitude of the negative biasing voltage being inversely proportional to a memory cell supply voltage level provided at a memory cell supply voltage node, the bitline biasing circuit including a capacitor and first and second switch circuits, the first switch circuit being operable during a first phase to charge the capacitor and the second switch circuit being operable during a second phase following the first phase to couple the capacitor to the bitline.

12. The memory device of claim 11, wherein:
    the first switching circuit couples the capacitor to a positive power supply voltage during the first phase to charge the capacitor;
    the second switching circuit couples the capacitor between the memory cell supply voltage node and the bitline during the second phase; and
    the positive power supply voltage is greater than the memory cell supply voltage.

13. The memory device of claim 12, wherein the first switching circuit comprises first and second switch elements, the first switch element coupling a first conductor of the capacitor to a positive power supply voltage node corresponding to the positive power supply voltage and the second switch element coupling a second conductor of the capacitor to a ground node.

14. The memory device of claim 13, wherein the second switching circuit comprises third and fourth switch elements, the third switch element coupling the first conductor of the capacitor to the memory cell supply voltage node and the fourth switch element coupling the second conductor to the bitline.

15. The memory device of claim 11, wherein:
the first switching circuit couples the capacitor between a positive power supply voltage node and the memory cell supply voltage node during a first phase to charge the capacitor;
the second switching circuit couples the capacitor to the bitline during the second phase; and
the positive power supply voltage is greater than the memory cell supply voltage.

16. The memory device of claim 15, wherein the first switching circuit comprises first and second switch elements, the first switch element coupling a first conductor of the capacitor to the positive power supply voltage node and the second switch element coupling a second conductor of the capacitor to the memory cell supply voltage node.

17. The memory device of claim 16, wherein the second switching circuit comprises third and fourth switch elements, the third switch element coupling the first conductor of the capacitor to a ground node and the fourth switch element coupling the second conductor to the bitline.

18. A SRAM memory device comprising:
an array of SRAM memory cells, each cell being coupled between a memory cell supply voltage node and a second supply voltage node; and
a biasing circuit for providing a memory cell supply voltage at the memory cell supply voltage node during a read operation, the biasing circuit comprising a capacitor and first and second switch circuits, the first switch circuit being operable during a first phase to charge the capacitor and the second switch circuit being operable during a second phase following the first phase to couple the charged capacitor to a memory cell supply voltage node during the read operation.

19. The SRAM memory device of claim 18, wherein the first switch circuit couples the capacitor to a first power supply for charging the capacitor, and the second switching circuit couples the capacitor in series between a second power supply and the memory cell supply voltage node.

* * * * *